United States Patent [19]

Kinoshita et al.

[11] Patent Number: 5,442,202
[45] Date of Patent: Aug. 15, 1995

[54] SEMICONDUCTOR LIGHT EMITTING ELEMENT

[75] Inventors: Hiroaki Kinoshita; Kunihiro Hattori; Kazumasa Dobashi, all of Itami, Japan

[73] Assignee: Mitsubishi Cable Industries, Ltd., Hyogo, Japan

[21] Appl. No.: 330,838

[22] Filed: Oct. 27, 1994

[30] Foreign Application Priority Data

Oct. 29, 1993 [JP] Japan .................................. 5-272053
Feb. 18, 1994 [JP] Japan .................................. 6-020880

[51] Int. Cl.⁶ ............................................. H01L 33/00
[52] U.S. Cl. .......................................... 257/94; 257/96; 257/97; 257/101; 257/102; 372/43; 372/44
[58] Field of Search ................. 257/13, 94, 96, 97, 257/101, 102, 90; 372/43, 44, 45, 46

[56] References Cited

U.S. PATENT DOCUMENTS

| | | | |
|---|---|---|---|
| 4,414,558 | 11/1983 | Nishizawa et al. | 257/96 |
| 4,864,369 | 9/1989 | Snyder et al. | 257/97 |
| 5,077,588 | 12/1991 | Yamada et al. | 257/96 |
| 5,272,362 | 12/1993 | Yagi et al. | 257/94 X |
| 5,323,027 | 6/1994 | Yamada et al. | 257/94 |

*Primary Examiner*—William Mintel
*Attorney, Agent, or Firm*—Sughrue, Mion, Zinn, Macpeak & Seas

[57] ABSTRACT

A semiconductor light emitting element comprising plural semiconductor layers inclusive of a light emitting part having a pn junction, which are laminated on a crystal substrate, wherein a first semiconductor layer, having a carrier concentration of not more than $5 \times 10^{17}$ cm$^{-3}$ and a band gap of not less than the energy of the light emitted from the light emitting part, is formed in the passage of the light emitted from the light emitting part toward the substrate side, and a second semiconductor layer, having a carrier concentration of not more than $5 \times 10^{17}$ cm$^{-3}$ and a band gap of not greater than the energy of the light emitted from the light emitting part, is formed behind (when seen from the passage of the light) the first layer. According to the present invention, sub-peak wavelength light emission can be suppressed to a satisfactory degree.

10 Claims, 5 Drawing Sheets

SEMICONDUCTOR LIGHT EMITTING ELEMENT

FIELD OF THE INVENTION

The present invention relates to a light emitting element capable of controlling and suppressing detrimental light having a wavelength different from that of the light emitted from the light emitting part of a semiconductor light emitting element (hereinafter referred to as light emitting element) such as a light emitting diode (LED) and a laser diode (LD).

BACKGROUND OF THE INVENTION

The light emission of a light emitting element such as an LED or an LD is a release of energy upon recombination of free electrons and holes, which is induced by the application of a voltage in the forward direction to a pn junction formed in a semiconductor crystal.

The wavelength of the light to be emitted by the light emitting element is mostly decided by the band gap of the material for a semiconductor crystal used as an active layer.

The light is not limited to a single wavelength but may have a specific range of wavelength including a certain central wavelength as a peak.

In the present specification, the central wavelength of the light to be emitted by a light emitting element is referred to as main peak wavelength and the light over a specific range of wavelengths including a certain central wavelength as a peak is referred to as main peak wavelength light.

Figure 7:
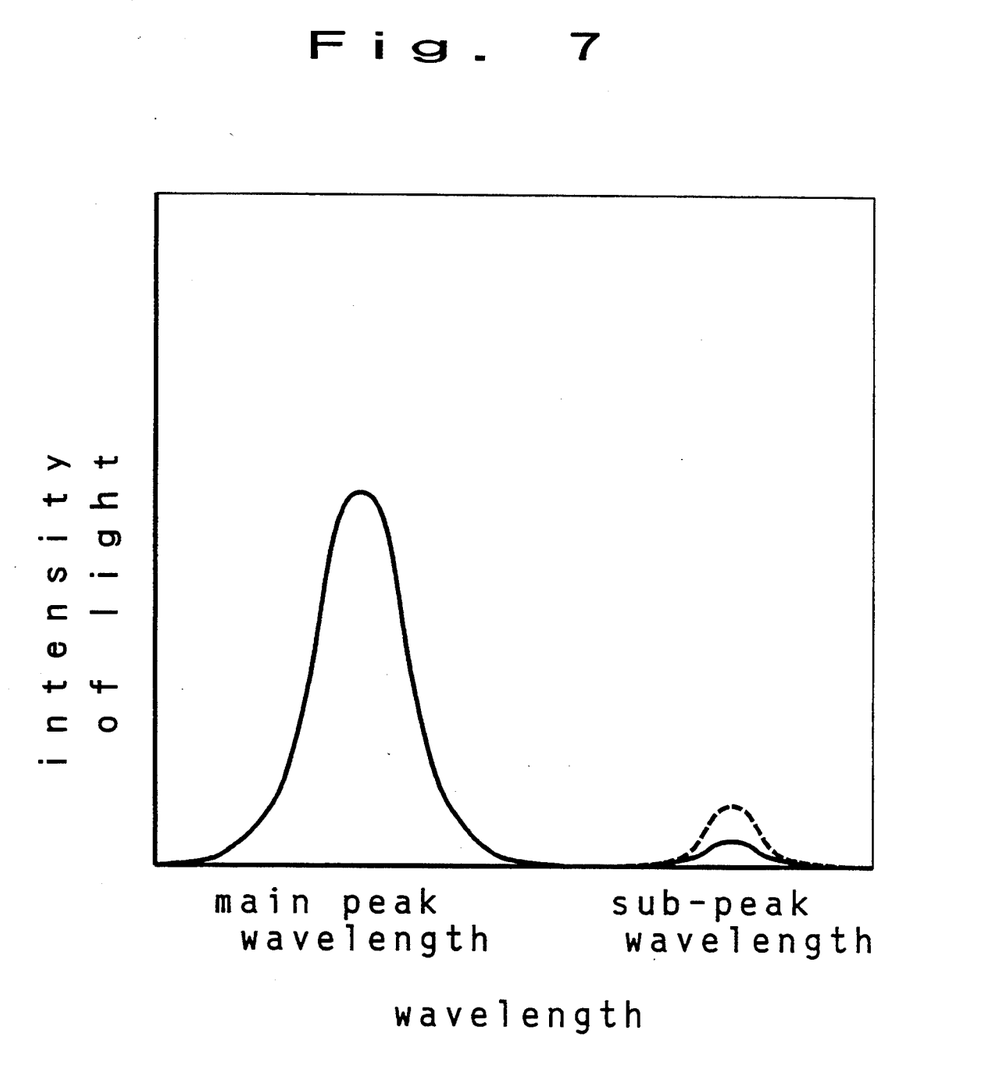
FIG. 7 is a graph-showing the relation between the wavelength and intensity of light emission in the light emitting element of the present invention and a conventional one, wherein the solid line is the present invention and the broken line is a conventional light emitting element.

There is a problematic case in actual light emitting elements, where emission of light occurs in a different wavelength other than the main peak wavelength. Taking the case of a red LED wherein a pn junction of AlGaAs is formed as a light emitting part on a GaAs substrate by crystal growth for example, a light emission having a peak at around 880-900 nm can be observed, in addition to a light emission at the main peak wavelength of 650-670 nm, as shown in FIG. 7.

In the present specification, the central wavelength of such a light emission is referred to as a sub-peak wavelength and the light over a specific range of wavelengths including the sub-peak wavelength as a peak is referred to as sub-peak wavelength light.

The sub-peak wavelength light is not intended in the design of a light emitting element which aims at a light emission at a desired wavelength. The light emitting element involving such an unintended light emission is responsible for the malfunction and various other problems of, for example, a photoelectric sensor wherein the element is used as a light source.

The occurrence of sub-peak wavelength light emission is ascribed to the photoluminescence released as a result of excitation of a crystal substrate due to the irradiation of main peak wavelength light. In view of this phenomenon, the carrier concentration of a substrate is made low to about $1 \times 10^{16} - 1 \times 10^{18}$ cm$^{-3}$ or a thin film having a similar carrier concentration is formed between the light emitting part and the substrate, in an attempt to suppress the intensity of the photoluminescence which constitutes a sub-peak wavelength light.

Such an attempt is not entirely satisfactory, since the layer with lower carrier concentration suffers from diffusion of dopant from the adjoining light emitting part, etc., causing an increase in carrier concentration. The increased carrier concentration leads to a maximum suppression of the intensity of the sub-peak wavelength light to about 1.5-3% of the intensity of the main peak wavelength light, so that the suppression of the intensity below that level has been unattainable.

SUMMARY OF THE INVENTION

Accordingly, an object of the present invention is to impart a novel structure which enables suppression of sub-peak wavelength light emission to a light emitting element.

The light emitting element of the present invention comprises plural semiconductor layers inclusive of a light emitting part having a pn junction, the layers being laminated on a crystal substrate, wherein a first semiconductor layer, having a carrier concentration of not more than $5 \times 10^{17}$ cm$^{-3}$ and a band gap of not less than the energy of the light emitted from the light emitting part, is formed in the passage of the light emitted from the light emitting part toward the substrate side, and a second semiconductor layer, having a carrier concentration of not more than $5 \times 10^{17}$ cm$^{-3}$ and a band gap of not greater than the energy of the light emitted from the light emitting part and reaching the second layer, is formed behind (when seen from the passage of the light) the first semiconductor layer.

The first semiconductor layer may be a layer forming the pn junction and on the substrate side. The second semiconductor layer may be the substrate. Further, the first semiconductor layer may be a layer forming the pn junction and on the substrate side, and the second semiconductor layer may be the substrate.

In the following description, the first semiconductor layer is referred to as the first layer and the second semiconductor layer is referred to as the second layer.

DETAILED DESCRIPTION OF THE INVENTION

The suppression of sub-peak wavelength light by the present invention is described in detail by illustrating an LED as a specific example of the light emitting element of the present invention.

Figure 1:
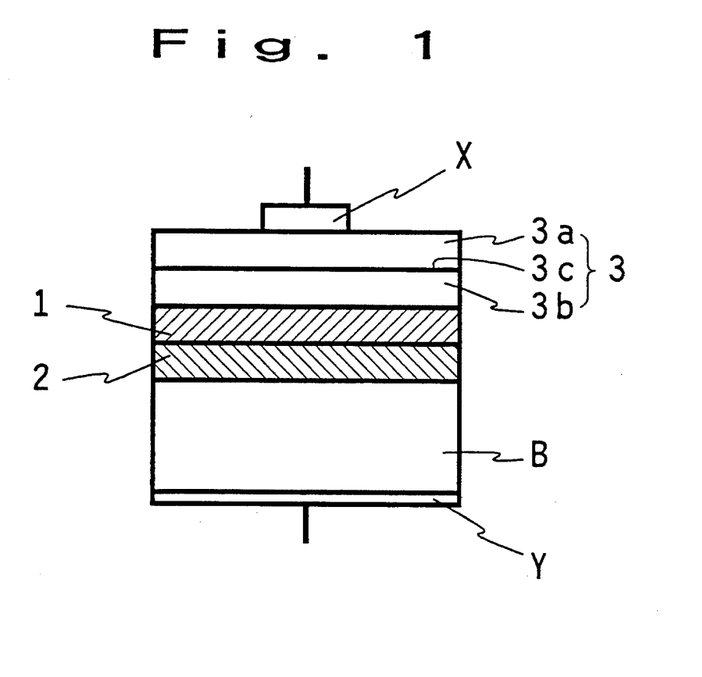
FIG. 1 schematically shows one embodiment of the light emitting element of the present invention, wherein a first layer 1 and a second layer 2 are hatched.

FIG. 1 schematically shows one embodiment of an LED according to the present invention, wherein a second layer 2, having a carrier concentration of not more than $5 \times 10^{17}$ cm$^{-3}$ and a band gap not greater than the energy of the light emitted from the light emitting part, is formed on a substrate B; a first layer 1, having a carrier concentration of not more than $5 \times 10^{17}$ cm$^{-3}$ and a band gap not less than the energy of the light emitted from the light emitting part is formed on the layer 2; and a light emitting part 3 with a pn junction is formed on the layer 1. In the Figure, the light emitting part 3 comprises an n-type semiconductor layer 3a, an optionally formed active layer 3c, and a p-type semiconductor layer 3b. X and Y are electrodes.

The energy of light is an amount determined by the wavelength λ of the light and expressed by the formula hc/λ, wherein h is Planck's constant and c is the speed of light.

Figure 6:
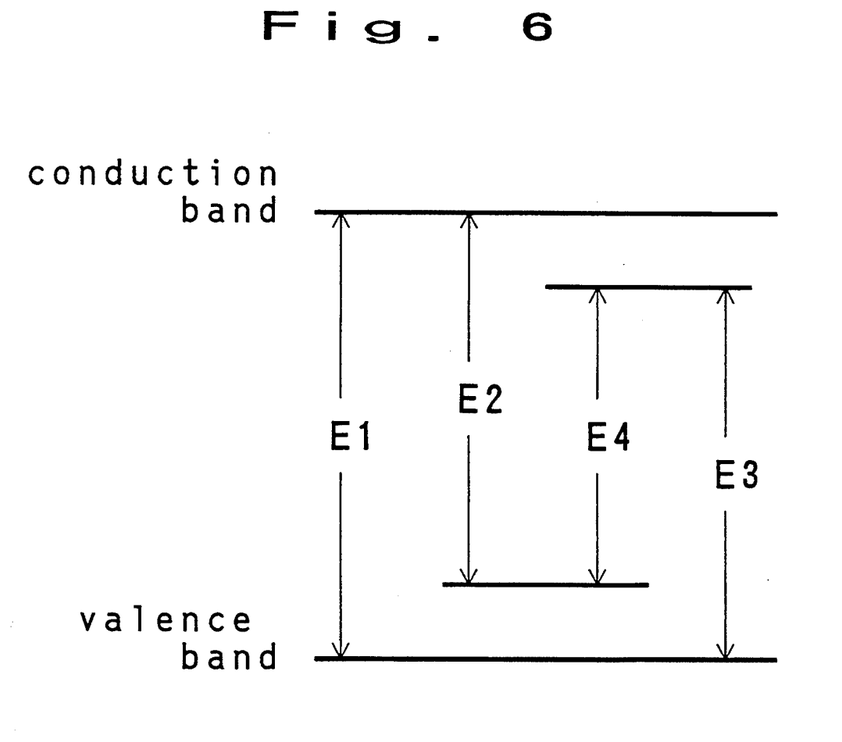
FIG. 6 shows the band gap of a semiconductor in the present invention.

The band gap is a band of energy state that electrons in a solid cannot assume and also is referred to as an energy gap or a forbidden band. In the present specification, band gap means, as shown in FIG. 6, not only the band gap E1 of an intrinsic semiconductor but also band gaps E2 and E3 between the impurity band due to impurities in the semiconductor and an intrinsic semiconductor band, and band gap E4 between impurity bands.

When the light of a specific wavelength passes through a semiconductor layer, the light having an energy smaller than the band gap of said semiconductor layer merely passes through the semiconductor layer. On the other hand, the light having an energy not smaller than the band gap of said semiconductor layer is absorbed by the semiconductor layer. The absorbed light excites said semiconductor layer to cause emission of the sub-peak wavelength light according to the band gap of the semiconductor layer.

The band gap of the first layer is not less than the energy of the light emitted from the light emitting part. Firstly, a first layer having a band gap greater than the energy of the light emitted from the light emitting part is described in detail in the following.

In an LED comprising the first and the second layers as described in the foregoing, the light emitted from the light emitting part toward the substrate side enters the first layer. With the band gap of the first layer greater than the energy of the light emitted from said part, the light passes through the layer and enters the second layer therebehind.

The second layer has a band gap not greater than the energy of the light and the incident light is absorbed by said layer. With the carrier concentration of the layer not more than $5 \times 10^{17}$ cm$^{-3}$, the sub-peak wavelength light is suppressed.

With the carrier concentration of the first layer not more than $5 \times 10^{17}$ cm$^{-3}$, the layer prevents diffusion of dopant into the second layer from other layers such as the light emitting part. As a result, an increase of the carrier concentration of the second layer is prevented, whereby the suppression of the sub-peak wavelength light from the second layer is desirably maintained.

The structure as exemplified by illustrating the LED as described results in desirable suppression of sub-peak wavelength light in the light emitting element of the present invention to not more than 1% of the intensity of the main peak wavelength light.

The carrier concentration of the first and the second layers is not more than $5 \times 10^{17}$ cm$^{-3}$ and the lower limit thereof is preferably not less than $1 \times 10^{17}$ cm$^{-3}$, in view of the contact resistance value of an ohmic electrode when an electrode is formed on these layers. When an electrode is not formed on these layers, the lower limit of the carrier concentration is preferably not less than $5 \times 10^{16}$ cm$^{-3}$, in view of stability and reproducibility of the crystal growth.

The pn junction is formed by a semiconductor crystal capable of emitting light, be it visible or invisible light, by the application of current in the forward direction.

The conductivity type of the pn junction may be n or p at the substrate side, provided that the conductivity type of the substrate side layer is the same as the conductivity type of the semiconductor layer on the substrate side. For example, when a p-type layer (3b in FIG. 1) comes to the substrate side, the first layer, the second layer and the substrate have p-type conductivity in the semiconductor layer of FIG. 1. In the present specification to follow, a semiconductor, wherein a p-type layer of the pn junction comes to the substrate side, is illustrated.

The first layer and the second layer are different layers composed of materials having different crystal structures and different component ratios at the juncture part. The layers may be any insofar as they permit crystal growth on the substrate.

The material for the first layer only needs to have a band gap permitting the light emitted from the light emitting part to pass through the layer.

The material for the second layer only needs to have a band gap not more than, particularly smaller than, the energy of the light that passed the first layer. To be specific, the composition ratio of the material may be decided to afford a smaller band gap than that of the material forming the pn junction.

The thickness of the first layer and the second layer is not particularly limited. When the two layers are formed independently without simultaneously constituting different layers, they are preferably made small so as to make the variation in the composition ratio in the thickness direction as observed in the case of polycompound mixed crystals less and to shorten the growth time. The are generally about 0.5–50 μm, preferably about 1–40 μm, particularly preferably about 1–20 μm.

Substrate 4 is a base crystal to form various semiconductor crystal layers such as a pn junction thereon and may be any insofar as it shows a good lattice match with a single element semiconductor, a compound semiconductor and semiconductor crystals to be grown thereon.

Examples of the materials preferably used for the pn junction, the first layer, the second layer and the substrate, as well as preferable combinations thereof are shown in Table 1.

TABLE 1

| n-type layer 3a | active layer 3c | p-type layer 3b | first layer 1 | second layer 2 | substrate B |
|---|---|---|---|---|---|
| Al$_{0.7}$Ga$_{0.3}$As ($1 \times 10^{18}$) | — | Al$_{0.35}$Ga$_{0.65}$As ($6 \times 10^{17}$) | Al$_{0.5}$Ga$_{0.5}$As ($5 \times 10^{17}$) | GaAs ($5 \times 10^{17}$) | GaAs ($1 \times 10^{19}$) |
| Al$_{0.7}$Ga$_{0.3}$As ($1 \times 10^{18}$) | Al$_{0.35}$Ga$_{0.65}$As ($5 \times 10^{17}$) | Al$_{0.7}$Ga$_{0.3}$As ($6 \times 10^{17}$) | Al$_{0.5}$Ga$_{0.5}$As ($5 \times 10^{17}$) | GaAs ($5 \times 10^{17}$) | GaAs ($1 \times 10^{19}$) |

The figures in the parentheses in Table 1 are carrier concentrations (unit $cm^{-3}$), hereinafter the same.

The method for forming the first layer, the second layer and the pn junction on a substrate is preferably a method capable of epitaxial growth and is exemplified by VPE (Vapor Phase Epitaxy), LPE (Liquid Phase Epitaxy), MOVPE (Metal Organic Vapor Phase Epitaxy) and MBE (Molecular Beam Epitaxy).

In particular, slow cooling in LPE is preferably used, in view of safety which is higher than vapor phase epitaxy, and easy to produce regardless of amount.

The first layer may be a semiconductor layer on the substrate side, which forms a pn junction. The second layer may be a substrate. Further, the first layer may be a semiconductor layer on the substrate side and form a pn junction and the second layer may be a substrate. These structures make the structure of the light emitting element as simple as conventional ones. The structures are explained by referring to examples thereof.

Other embodiments are described in the following.

Figure 2:
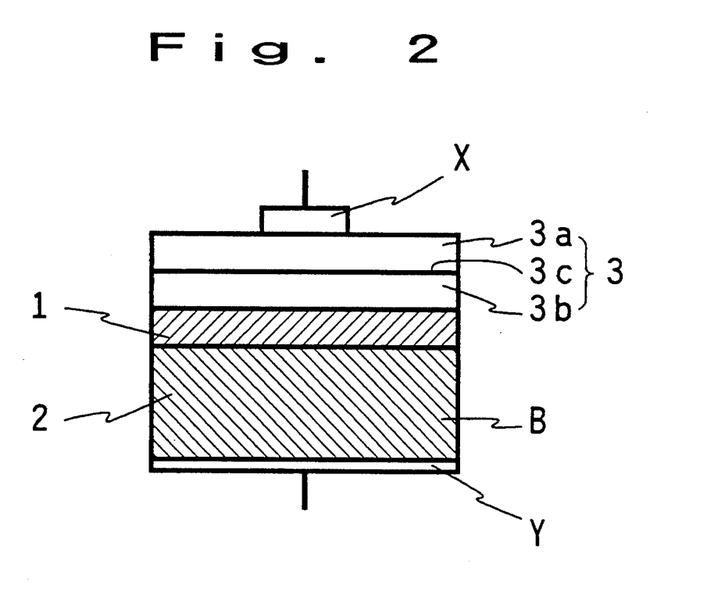
FIG. 2 schematically shows another embodiment of the light emitting the present invention.

FIG. 2 schematically shows another embodiment of the light emitting element of the present invention, which is the LED of FIG. 1 except that the substrate B is formed by a semiconductor crystal having a carrier concentration of not more than $5 \times 10^{17}$ $cm^{-3}$ and a band gap of not more than the energy of the light emitted from the light emitting part. Accordingly, the second layer 2 also functions as the substrate B.

This structure desirably enables markedly enhanced suppressive action on the sub-peak wavelength light without increasing the number of laminates, as compared with conventional light emitting elements.

Examples of the materials preferably used for the pn junction, the first layer, the second layer (i.e., the substrate), as well as preferable combinations thereof are shown in Table 2.

TABLE 2

| n-type layer 3a | active layer 3c | p-type layer 3b | first layer 1 | second layer (substrate B) |
|---|---|---|---|---|
| $Al_{0.7}Ga_{0.3}As$ ($1 \times 10^{18}$) | — | $Al_{0.35}Ga_{0.65}As$ ($6 \times 10^{17}$) | $Al_{0.5}Ga_{0.5}As$ ($1 \times 10^{17}$) | GaAs ($1 \times 10^{17}$)–($5 \times 10^{17}$) |
| $Al_{0.7}Ga_{0.3}As$ ($1 \times 10^{18}$) | $Al_{0.35}Ga_{0.65}As$ ($5 \times 10^{17}$) | $Al_{0.7}Ga_{0.3}As$ ($6 \times 10^{17}$) | $Al_{0.5}Ga_{0.5}As$ ($5 \times 10^{17}$) | GaAs ($1 \times 10^{17}$)–($5 \times 10^{17}$) |

Figure 3:
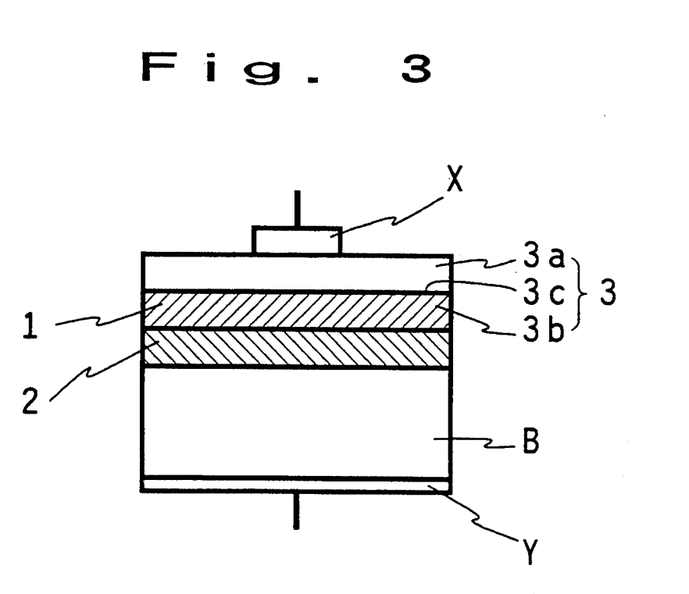
FIG. 3.schematically shows still another embodiment of the light emitting element of the present invention.

FIG. 3 schematically shows another embodiment of the light emitting element of the present invention, wherein the LED is the same as that in FIG. 1 except that the semiconductor layer on the substrate side (p-type layer 3b), which constitutes the pn junction, is made to have a carrier concentration of not more than $5 \times 10^{17}$ $cm^{-3}$ and also functions as the first layer 1.

This structure is also desirable for the same reason given in the above for the structure of FIG. 2.

Examples of the materials preferably used for the pn junction, the first layer (i.e. the p-type semiconductor layer), the second layer and substrate, as well as preferable combinations thereof are shown in Table 3.

TABLE 3

| n-type layer 3a | active layer 3c | first layer 1 (p-type layer 3b) | second layer 2 | substrate B |
|---|---|---|---|---|
| $Al_{0.7}Ga_{0.3}As$ ($1 \times 10^{18}$) | — | $Al_{0.35}Ga_{0.65}As$ ($5 \times 10^{17}$) | GaAs ($5 \times 10^{17}$) | GaAs ($1 \times 10^{19}$) |
| $Al_{0.7}Ga_{0.3}As$ ($1 \times 10^{18}$) | $Al_{0.35}Ga_{0.65}As$ ($5 \times 10^{17}$)–($6 \times 10^{17}$) | GaAs ($5 \times 10^{17}$) | GaAs ($5 \times 10^{17}$) | GaAs ($1 \times 10^{19}$) |

Figure 4:
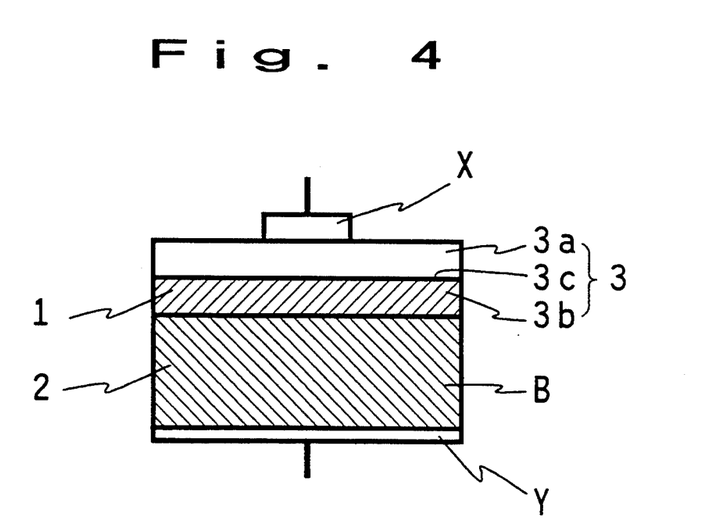
FIG. 4 schematically shows a further embodiment of the light emitting element of the present invention.

FIG. 4 schematically shows another embodiment of the light emitting element of the present invention, wherein the LED is the same as that in FIG. 3 except that the substrate B is formed by a semiconductor crystal having a carrier concentration of not more than $5 \times 10^{17}$ $cm^{-3}$ and a band gap of not greater than the energy of the light emitted from the light emitting part, whereby the first layer 1 also functions as a p-type semiconductor layer 3b and the second layer 2 also functions as the substrate B.

This structure is the same as the basic light emitting diode except that it has more enhanced suppressive action on sub-peak wavelength light than is provided by the conventional light emitting elements.

Examples of the materials preferably used for the pn junction, the first layer (i.e., the p-type semiconductor layer), the second layer (i.e., the substrate), as well as preferable combinations thereof are shown in Table 4.

TABLE 4

| n-type layer 3a | active layer 3c | first layer 1 (p-type layer 3b) | second layer 2 (substrate B) |
|---|---|---|---|
| $Al_{0.7}Ga_{0.3}As$ ($1 \times 10^{18}$) | — | $Al_{0.35}Ga_{0.65}As$ ($5 \times 10^{17}$) | GaAs ($5 \times 10^{17}$) |
| $Al_{0.7}Ga_{0.3}As$ ($1 \times 10^{18}$) | $Al_{0.35}Ga_{0.65}As$ ($5 \times 10^{17}$)–($6 \times 10^{17}$) | $Al_{0.7}Ga_{0.3}As$ ($5 \times 10^{17}$) | GaAs ($5 \times 10^{17}$) |

Tables 1–4 in the above relate to the light emitting elements with the band gap of the first layer greater than the energy of the light emitted from the light emitting part.

Then, a light emitting element with the band gap of the first layer, which is the same as the energy of the light emitted from the light emitting part, is described in the following. With such a structure, special effects can be obtained in addition to the effects explained for the embodiments of FIGS. 1–4, making the suppression of the sub-peak wavelength light certainly effective.

The band gap of the first layer, which is the same as the energy of the light emitted from the light emitting part, means not only the theoretically identical band gap of the first layer and the energy $hc/\lambda$ of the light having the central wavelength $\lambda$, which is emitted from the light emitting part, but also approximately identical values of the two energies within the allowable range of about ±0.03 eV in actual use.

Figure 5:
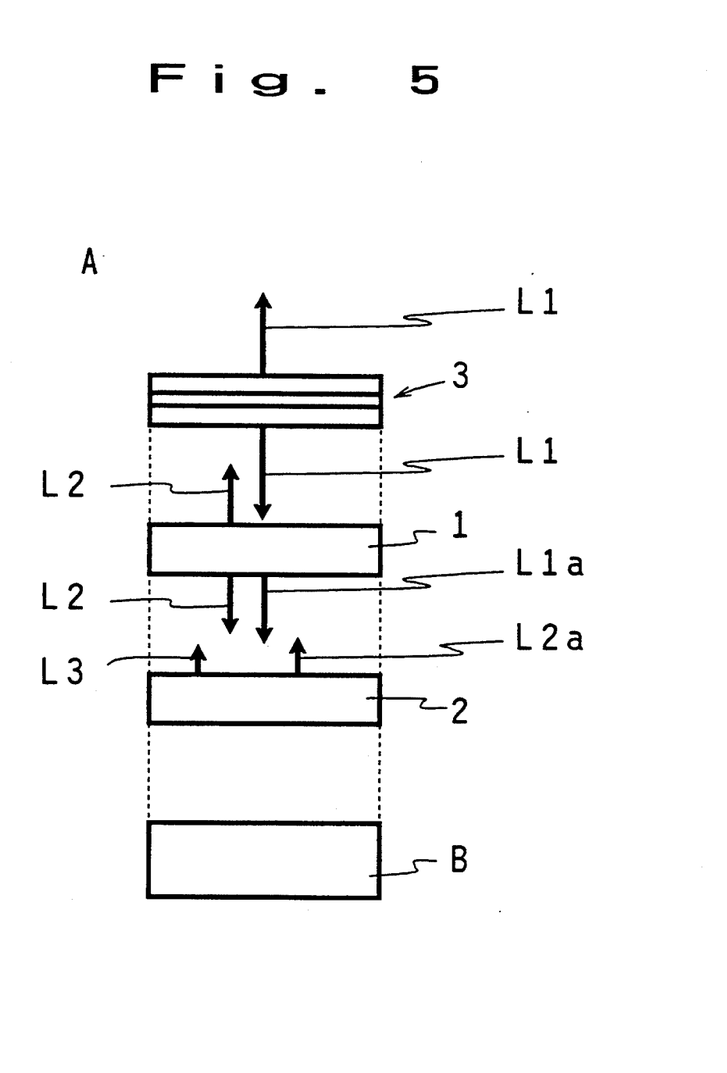
FIG. 5 shows suppression of sub-peak wavelength light by the light emitting element of the present invention.

The action of the light emitting element, wherein the band gap of the first layer is the same as the energy of the light emitted from the light emitting part, is explained by referring to FIG. 5. FIG. 5 schematically shows the structure of an LED as one embodiment of the light emitting element of the present invention, wherein a first layer 1, having a carrier concentration of not more than $5 \times 10^{17}$ cm$^{-3}$ and a band gap the same as the energy of a light L1 emitted from a light emitting part 3 toward the substrate side, is formed in the passage of the light, and a second layer 2, having a carrier concentration of not more than $5 \times 10^{17}$ cm$^{-3}$ and a band gap of not greater than the energy of the light L1, is formed behind the first semiconductor layer when seen from the passage of L1.

In the Figure, A is an outer world toward which the light is emitted, L is the light emitted toward the outer world A, B is a substrate and the light is expressed with thick arrows. The accessories such as electrodes are omitted.

The light L1 emitted from the light emitting part 3 comprises the light over a specific wavelength band inclusive of the main peak wavelength as a central wavelength. Of the light L1, the light having the energy not less than the band gap of the first layer 1, namely, the light having a shorter wavelength (the central wavelength inclusive) is absorbed by the first layer 1. The first layer 1 is excited thereby to emit a photoluminescence L2 which is a sub-peak wavelength light. However, the photoluminescence L2 has the same central wavelength as that of the main peak wavelength light L1, since the band gap of the first layer is set for the same energy as that of the light having the main peak wavelength. Accordingly, the sub-peak wavelength photoluminescence becomes the main peak wavelength light, suppressing the total sub-peak wavelength light.

Of the light L1, the light having the energy smaller than the band gap of the first layer 1, namely, the light having a longer wavelength is not absorbed by the first layer 1, but passes through said layer. The light (L1a) which passed the layer enters the second layer 2 formed behind the first layer 1. The band gap of the second layer 2, which is not more than, preferably smaller than, the energy of the light L1 emitted from the light emitting part 3, leads to complete absorption of the light L1a by this layer.

The band gap of the second layer, which is not more than the energy of the light L1 emitted from the light emitting part, means the band gap great enough to substantially completely absorb the light that reached the second layer.

Absorption of the light L1a by the second layer 2 in turn results in emission of photoluminescence L2a, which is a detrimental sub-peak wavelength light. However, the intensity of the sub-peak wavelength light L2a becomes extremely low, since the intensity of the light L1a which reaches the second layer is approximately one-half of the intensity of the original light L1, and a carrier concentration of the second layer is set for not more than $5 \times 10^{17}$ cm$^{-3}$.

While the photoluminescence L2, which is a main peak wavelength light emitted from the first semiconductor layer 1 toward the substrate side, is also irradiated on the second layer in addition to the light L1a, the light L2 is a weak, secondarily emitted light as a photoluminescence and a photoluminescence L3 tertiarily generated from the second layer due to the irradiation of the light L2 is in too slight an amount to cause any problem.

Accordingly, only the photoluminescence L2a occurring from the second layer due to the light L1a which passed through the first layer constitutes substantial sub-peak wavelength light, permitting sufficient suppression as a whole.

The first layer prevents diffusion of dopant into the second layer, as in the above-mentioned embodiments.

The band gap of the first layer need not be uniform through the entire thickness but only needs to be, in part thereof, substantially identical with the energy of the light emitted from the light emitting part. For example, the composition ratios may gradually vary in the thickness direction depending on the method for crystal growth of said absorption layer. In such a case, it is preferable that the part of the layer other than the part having a band gap identical with the energy of the light emitted from the pn junction should have a band gap greater than the energy of the light, so that the light can merely pass through the first layer.

As an embodiment wherein the band gap of the first layer is the same as the energy of the light emitted from the light emitting part, exemplified is an LED of FIG. 1 wherein the band gap of the first layer is the same as the energy of the light emitted from the light emitting part. The structure of the LED is the same as the LED of FIG. 1 for the part other than what is to be explained in the following.

The material for the first layer may be any insofar as it has the same band gap as the energy of the main peak wavelength light. In actual use, however, a combination of semiconductor materials having a band gap substantially the same as the band gap of the semiconductor material constituting the pn junction is preferable. The use of the semiconductor materials having the same composition ratio for the light emitting part in the pn junction and the first layer can make the energy of the light emitted from the pn junction and the band gap of the first layer the same with ease.

Examples of the materials preferably used for the pn junction, the first layer, the second layer and substrate, as well as preferable combinations thereof are shown in Table 5.

TABLE 5

| n-type layer 3a | active layer 3c | p-type layer 3b | first layer 1 | second layer 2 | substrate B |
| --- | --- | --- | --- | --- | --- |
| $Al_{0.7}Ga_{0.3}As$ ($1 \times 10^{18}$) | — | $Al_{0.35}Ga_{0.65}As$ ($3 \times 10^{18}$) | $Al_{0.35}Ga_{0.65}As$ ($1 \times 10^{17}$) | GaAs ($1 \times 10^{17}$) | GaAs ($1 \times 10^{19}$) |
| $Al_{0.7}Ga_{0.3}As$ ($1 \times 10^{18}$) | $Al_{0.35}Ga_{0.65}As$ ($3 \times 10^{17}$) | $Al_{0.7}Ga_{0.3}As$ ($3 \times 10^{17}$) | $Al_{0.35}Ga_{0.65}As$ ($5 \times 10^{17}$) | GaAs ($5 \times 10^{17}$) | GaAs ($1 \times 10^{19}$) |
| $Al_{0.7}Ga_{0.3}As$ ($1 \times 10^{18}$) | $Al_{0.35}Ga_{0.65}As$ ($3 \times 10^{17}$) | $Al_{0.7}Ga_{0.3}As$ ($3 \times 10^{17}$) | $Al_{0.35}Ga_{0.65}As$ ($1 \times 10^{18}$) | GaAs ($1 \times 10^{17}$) | GaAs ($1 \times 10^{19}$) |
| $Al_{0.7}Ga_{0.3}As$ | $Al_{0.35}Ga_{0.65}As$ | $Al_{0.7}Ga_{0.3}As$ | $Al_{0.35}Ga_{0.65}As$ | $Al_{0.1}Ga_{0.9}As$ | GaAs |

TABLE 5-continued

| n-type layer 3a | active layer 3c | p-type layer 3b | first layer 1 | second layer 2 | substrate B |
|---|---|---|---|---|---|
| $(1 \times 10^{18})$ | - $(3 \times 10^{17})$ | $(3 \times 10^{17})$ | $(1 \times 10^{17})$ | $(5 \times 10^{17})$ | $(1 \times 10^{19})$ |

When the band gap of the first layer is the same as the energy of the light emitted from the light emitting part, the second layer in the above embodiment may also function as a substrate as in the embodiment of FIG. 2.

This structure desirably enables markedly enhanced suppressive action on sub-peak wavelength light without increasing the number of laminates, as compared with conventional light emitting elements.

Examples of the materials preferably used for the pn junction, the first layer, the second layer (i.e., the substrate), as well as preferable combinations thereof are shown in Table 6.

TABLE 6

| n-type layer 3a | active layer 3c | p-type layer 3b | first layer 1 | second layer 2 substrate B) |
|---|---|---|---|---|
| $Al_{0.7}Ga_{0.3}As$ $(1 \times 10^{18})$ | — | $Al_{0.35}Ga_{0.65}As$ $(3 \times 10^{18})$ | $Al_{0.35}Ga_{0.65}As$ $(3 \times 10^{17})$ | GaAs $(1 \times 10^{17})$ |
| $Al_{0.7}Ga_{0.3}As$ $(1 \times 10^{18})$ | $Al_{0.35}Ga_{0.65}As$ $(3 \times 10^{17})$ | $Al_{0.7}Ga_{0.3}As$ $(3 \times 10^{17})$ | $Al_{0.35}Ga_{0.65}As$ $(5 \times 10^{17})$ | GaAs $(5 \times 10^{17})$ |
| $Al_{0.7}Ga_{0.3}As$ $(1 \times 10^{18})$ | $Al_{0.35}Ga_{0.65}As$ $(3 \times 10^{17})$ | $Al_{0.7}Ga_{0.3}As$ $(3 \times 10^{17})$ | $Al_{0.35}Ga_{0.65}As$ $(1 \times 10^{18})$ | GaAs $(1 \times 10^{17})$ |
| $Al_{0.7}Ga_{0.3}As$ $(1 \times 10^{18})$ | $Al_{0.35}Ga_{0.65}As$ $(3 \times 10^{17})$ | $Al_{0.7}Ga_{0.3}As$ $(3 \times 10^{17})$ | $Al_{0.35}Ga_{0.65}As$ $(1 \times 10^{17})$ | $Al_{0.1}Ga_{0.9}As$ $(5 \times 10^{17})$ |

In the present invention, the material to be used as a dopant for imparting the desired carrier concentration is not subject to any particular limitation and is exemplified by Zn, Te and Si. In particular, Zn exhibits quick diffusion into materials as compared with other dopant materials. The usefulness of the preventive action achieved in the present invention on the diffusion of dopant becomes prominent with regard to Zn.

In the present invention, the carrier concentration of the first layer and the second layer, which falls within the range of from $5 \times 10^{16}$ cm$^{-3}$ to $5 \times 10^{17}$ cm$^{-3}$ is conducive to the stable control of the sub-peak wavelength light at a desired level of not more than 1% of the intensity of the main peak wavelength light. Such stable, low level sub-peak wavelength light might possibly be exploited for a new use, making the control over sub-peak wavelength light advantageous.

The embodiments of the light emitting element as described above are simple examples of a light emitting element. The pn junction may be a single-hetero junction or a double-hetero junction as exemplified above, or a multi-layer junction such as a homo junction, a single quantum well, a multiple quantum well or the like.

By replacing the pn junction structure in various ways, a multitude of light emitting elements capable of suppressing sub-peak wavelength light can be obtained.

[Efficiency Test]

The light emitting element as described above was subjected to a light emission test to examine suppression of sub-peak wavelength light.

The light emitting element used was a light emitting diode of FIG. 4 and the materials for the substrate and pn junction were as shown in Table 4, the first combination. That is:

pn junction (n-type layer): $Al_{0.7}Ga_{0.3}As$   $(1 \times 10^{18})$

-continued

| first layer (p-type layer): $Al_{0.35}Ga_{0.65}As$ | $(5 \times 10^{17})$ |
| second layer (substrate): GaAs | $(5 \times 10^{17})$ |

The figures in parentheses show carrier concentration (unit cm$^{-3}$).

FIG. 7 is a graph showing the relation between wavelength and intensity of emitted light with respect to said light emitting diode. As shown in thick lines in FIG. 7, the sub-peak wavelength light was observed in the wavelength band of 880-990 nm. However, the intensity thereof was not more than 1% of the intensity of the main peak wavelength light and sufficient suppressive action was confirmed.

In addition, respective light emitting elements made of the materials as shown in Tables 1-6 were subjected to the light measurement. As a result, the light emitting elements of the compositions of Tables 1-4 showed the intensity of the sub-peak wavelength light of not greater than 1% of that of the main peak wavelength light, as in the aforementioned test, and the light emitting elements of the compositions of Tables 5 and 6 showed the intensity of the sub-peak wavelength light of not greater than 0.7% of that of the main peak wavelength light.

What is claimed is:

1. A semiconductor light emitting element comprising plural semiconductor layers inclusive of a light emitting part having a pn junction, which are laminated on a crystal substrate, wherein a first semiconductor layer, having a carrier concentration of not more than $5 \times 10^{17}$ cm$^{-3}$ and a band gap of not less than the energy of the light emitted from the light emitting part, is formed in the passage of light emitted from the light emitting part toward the substrate side, and a second semiconductor layer, having a carrier concentration of not more than $5 \times 10^{17}$ cm$^{-3}$ and a band gap of not greater than the energy of the light emitted from the light emitting part, is formed behind (when seen from the passage of the light) the first layer.

2. The element of claim 1, wherein the band gap of the first semiconductor layer is greater than the energy of the light emitted from the light emitting part.

3. The element of claim 2, wherein the first semiconductor layer also functions as a semiconductor layer in the pn junction, which is on the substrate side.

4. The element of claim 2, wherein the second semiconductor layer also functions as a substrate.

5. The element of claim 2, wherein the first semiconductor layer also functions as a semiconductor layer in the pn junction, which is on the substrate side, and the second semiconductor layer also functions as a substrate.

6. The element of claim 1, wherein the band gap of the first semiconductor layer is the same as the energy of the light emitted from the light emitting part.

7. The element of claim 1, wherein the first semiconductor layer is composed of a layer having a band gap which is the same as the energy of the light emitted from the light emitting part and a layer having a band gap greater than said energy.

8. The element of claim 6, wherein the second semiconductor layer also functions as a substrate.

9. The element of claim 1, wherein the first semiconductor layer is 1 $\mu$m–40 $\mu$m in thickness and formed by slow cooling in Liquid Phase Epitaxy.

10. The element of claim 1, wherein a dopant determining the carrier concentration is Zn.

* * * * *